United States Patent
Harakawa

[19]

[11] Patent Number: 5,913,143
[45] Date of Patent: Jun. 15, 1999

[54] METHOD OF MAKING A MULTILAYER INTERCONNECTION OF SEMICONDUCTOR DEVICE USING PLUG

[75] Inventor: Hideaki Harakawa, Yokohama, Japan

[73] Assignee: Kabushiki Kaisha Toshiba, Kawasaki, Japan

[21] Appl. No.: 08/831,383

[22] Filed: Apr. 1, 1997

[30] Foreign Application Priority Data

Apr. 3, 1996 [JP] Japan .................................. 8-081145

[51] Int. Cl.$^6$ .................................................. H01L 21/4763
[52] U.S. Cl. .......................... 438/627; 438/629; 438/643; 438/653
[58] Field of Search .................................. 438/627, 629, 438/643, 653

[56] References Cited

U.S. PATENT DOCUMENTS 5,393,703  2/1995  Olowolafe et al. ..................... 438/627
5,472,912  12/1995  Miller ..................................... 438/627
5,747,379  5/1998  Huang et al. ........................... 438/627

*Primary Examiner*—John F. Niebling
*Assistant Examiner*—Lynne A. Gurley
*Attorney, Agent, or Firm*—Finnegan, Henderson, Farabow, Garrett & Dunner, L.L.P.

[57] ABSTRACT

An inter-level insulating film is formed on a first Al film and a contact hole is formed to partly expose the first Al film. A TiW film is formed on the internal side surface of the contact hole and a W film is formed to form a conductive plug. After a TiN film and a second Al film are formed on the plug and inter-level insulating film, a resist mask used for etching the above films is formed in position corresponding to the plug. By use of this plug, the second Al film and TiN film are removed by RIE using Cl-series gas. Since the selective etching ratio of TiW film/Ti film is approx. 0.2, etching of the TiW film in the plug can be suppressed even if the mask is formed in position deviated from the upper portion of the plug. Therefore, after formation of the insulating film, occurrence of void can be prevented, thereby enhancing the reliability and service life of the interconnection structure.

8 Claims, 4 Drawing Sheets

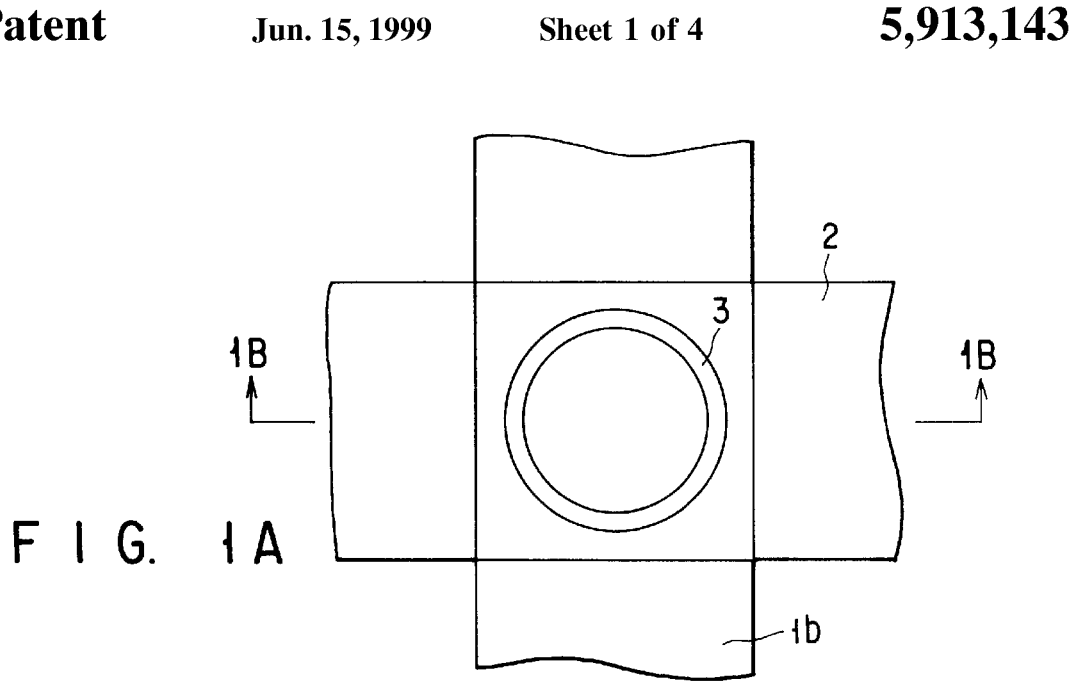
FIG. 1A
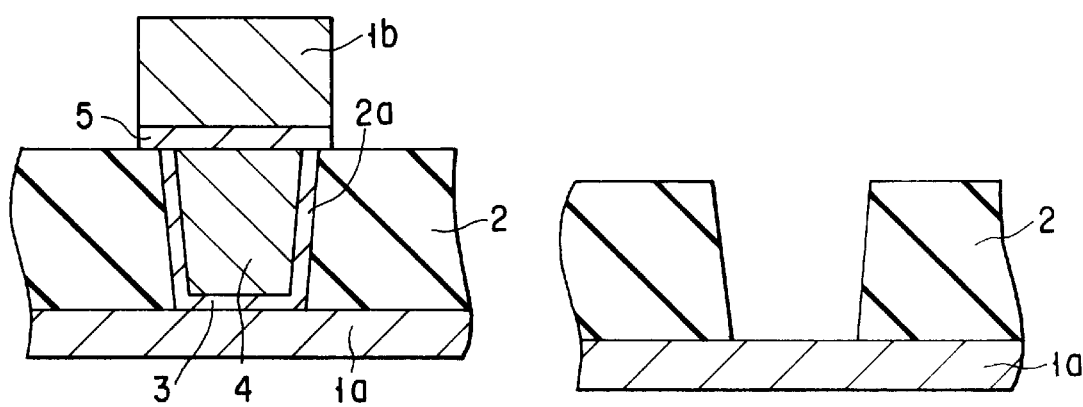
FIG. 1B
FIG. 2
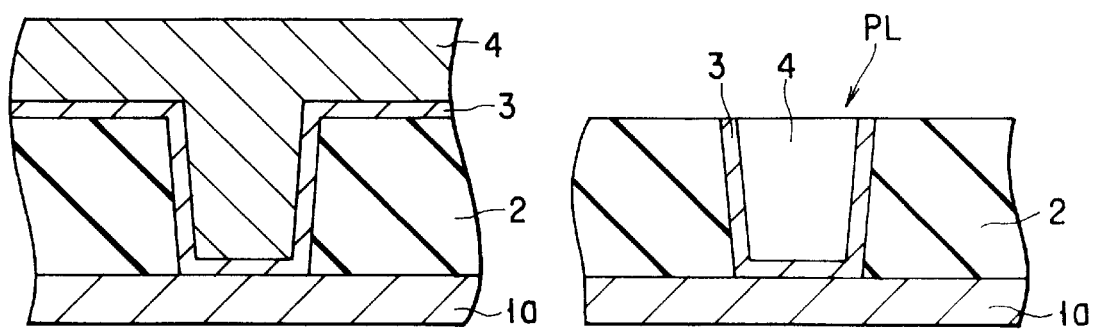
FIG. 3
FIG. 4

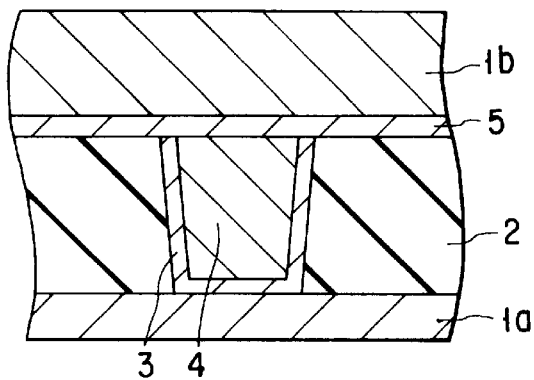
F I G. 5
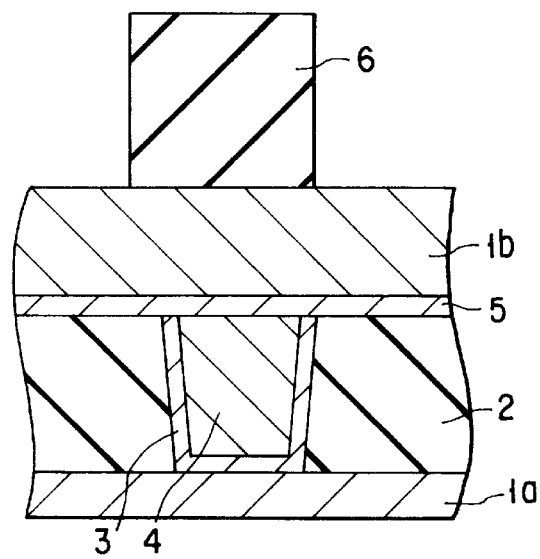
F I G. 6A
F I G. 6B
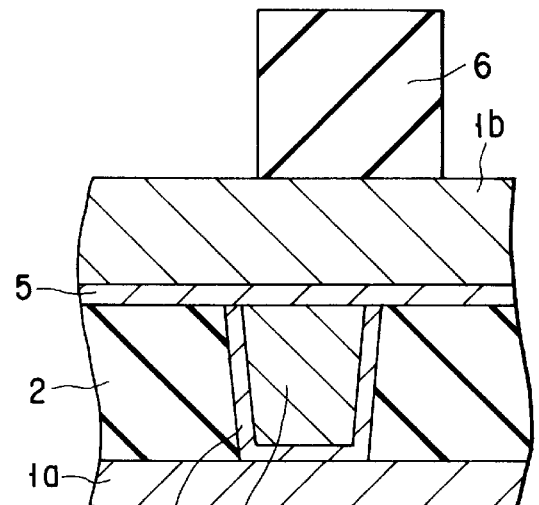
F I G. 7A
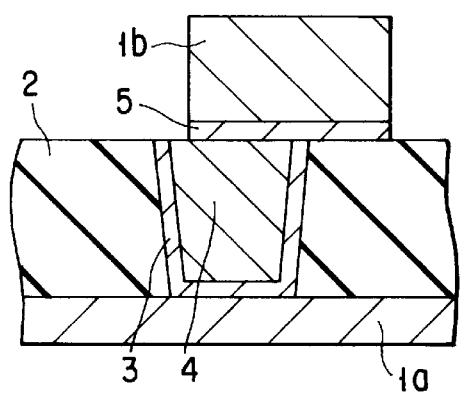
F I G. 7B

5,913,143

METHOD OF MAKING A MULTILAYER INTERCONNECTION OF SEMICONDUCTOR DEVICE USING PLUG

BACKGROUND OF THE INVENTION

This invention relates to a multilayer interconnection structure, and more particularly to a multilayer interconnection structure using a blanket W (tungsten) plug and a method for manufacturing the same.

As the size of elements is reduced, inter-connection layers for connecting the elements tend to be further miniaturized and more frequently formed into a multilayered form and this tendency is considered to persist also in the future. At present, it is required to set up the interconnecting technique of stable characteristic and high reliability capable of coping with the above tendency.

The conventional interconnection is explained below with reference to the accompanying drawings by taking a two-layered interconnection structure as an example. A semiconductor substrate having elements formed therein is disposed below the interconnection structure, but it is omitted in the drawing.

FIG. 9 is a schematic cross sectional view showing a conventional semiconductor device. In the conventional semiconductor device shown in FIG. 9, an inter-level insulating film 92 is formed on a first Al (aluminum) film 91a used as a lower interconnection layer and a contact hole 92a is formed in the inter-level insulating film 92 to partly expose the first Al film 91a. On the internal side surface of the contact hole 92a and part of the first Al film 91a corresponding to the bottom surface of the contact hole, a first TiN (titanium nitride) film 93 is formed and a W film 94 is formed to fill the contact hole 92a and form a plug. A second TiN film 95 is formed on the plug and an upper interconnection layer formed of a second Al film 91b is formed on the second TiN film 95.

Next, a method for manufacturing the semiconductor device of FIG. 9 is explained. FIGS. 10 to 14A, 14B show the manufacturing process for the conventional semiconductor device.

(1) As shown in FIG. 10, a first Al film 91a is formed on a semiconductor substrate (not shown). An inter-level insulating film 92 such as a CVD-SiO$_2$ film is formed on the surface of the first Al film 91a. The inter-level insulating film 92 is patterned into a preset shape by the RIE (reactive ion etching) technique to form a contact hole 92a therein to expose part of the surface of the first Al film 91a.

(2) As shown in FIG. 11, a first TiN film 93 is formed as a grow layer on the inter-level insulating film 92, the internal side surface of the contact hole and the first Al film 91a exposed in the contact hole by DC magnetron sputtering and then a W film 94 is formed on the first TiN film 93 by the CVD method. The film thickness of the first TiN film 93 is approx. 100 nm and the film thickness of the W film 94 is approx. 400 nm.

(3) Next, as shown in FIG. 12, after the planarization process by RIE using F-(fluorine)-series or O-(oxygen)-series gas is effected, the W film 94 and first TiN film 93 formed in a portion higher than the surface level of the inter-level insulating film 92 are removed by etching so as to form a plug PL in the contact hole.

(4) Then, as shown in FIG. 13, after a second TiN film 95 is formed on the inter-level insulating film 92, W film 94 and first TiN film 93 by DC magnetron sputtering, a second Al film 91b is formed on the second TiN film 95. The film thickness of the second TiN film 95 is approx. 50 nm and the film thickness of the second Al film 91b is approx. 800 nm.

(5) Next, a resist 96 is formed to a thickness of approx. 2.0 μm on the entire surface of the resultant structure, and then, as shown in FIG. 14A, the resist 96 is patterned by the lithography technology. The second Al film 91b and second TiN film 95 are etched by RIE using Cl-(chlorine)-series gas with the patterned resist used as a mask to form an upper interconnection layer as shown in FIG. 14B.

In the step (2), formation of the first TiN film 93 as the grow layer in the contact hole is indispensable for uniformly growing the W film by the CVD method.

As the size of elements is reduced, the width of a mask used for forming the upper interconnection layer 91b is extremely reduced and is made substantially equal to the width of the contact hole. As a result, the position of the resist 96 used for patterning the second Al film 91b and the second TiN film 95 is deviated from the upper position of the contact hole in some cases as shown in FIG. 15A.

After a wafer is set in the RIE device as in the normal way in this state, an etching gas is supplied to effect the RIE process, but in this case, since the distribution of the etching gas is non-uniform on the plane of the wafer, a variation occurs in the etching rate. As is well known in the art, if the second Al film 91b and the second TiN film 95 other than the interconnection layer portion are left behind on the inter-level insulating layer 92, the electrical characteristic of the element will be made defective. Therefore, variations in the film thicknesses of the second Al film 91b and the second TiN film 95 are taken into consideration and the etching process is effected until the second TiN film 95 can be patterned without fail in a region in which the etching rate is low.

In the RIE process using Cl-series gas, since the etching rate is slow for the W film in comparison with the etching rate for TiN, the first TiN film 93 is etched in a region in which the mask is not disposed. That is, since over-etching is effected to stably pattern the interconnection layer, the first TiN film 93 which covers the internal side surface of the contact hole and which is not usually removed is etched out as shown in FIG. 15B to provide a narrow space 93a. Since it is difficult to form an insulating film which is formed in the next step in the narrow space 93a, a void occurs in the narrow space 93a, thereby lowering the service life and reliability of the interconnection layer.

BRIEF SUMMARY OF THE INVENTION

An object of this invention is to provide a semiconductor device capable of enhancing the reliability and service life of an interconnection structure by preventing occurrence of a narrow space in a plug for connection between interconnection layers and suppressing occurrence of a void and a method for manufacturing the same.

The above object can be attained by a semiconductor device comprising a semiconductor substrate; a first interconnection layer formed on the semiconductor substrate; an insulating film formed on the first interconnection layer; a second interconnection layer formed on the insulating film; and a conductive plug formed in a contact hole which is formed in the insulating film, for electrically connecting the first and second interconnection layers to each other.

The conductive plug includes a first barrier metal film formed on the side surface and bottom surface of the contact hole and a first metal film filled in the contact hole and formed in contact with the first barrier metal film, the second interconnection layer includes a second barrier metal film formed of a material different from the first barrier metal film and formed in contact with the first barrier metal film and the first metal film and a second metal film formed on the second barrier metal film, and the etching rate for the second barrier metal film is higher than that for the first barrier metal film.

Therefore, the first barrier metal film will not be substantially etched when the second barrier metal film is etched.

Further, according to this invention, there is provided a method for manufacturing a semiconductor device, comprising the steps of forming an insulating film on a semiconductor substrate having a first interconnection layer formed thereon; forming a contact hole in the first insulating film to partly expose the first interconnection layer; forming a conductive plug including a first barrier metal film which is formed on the internal side surface and bottom surface of the contact hole and a first metal film which is filled in the contact hole and formed in contact with the first barrier metal film; forming a second barrier metal film on the semiconductor substrate to cover the first barrier metal film and the first metal film and forming a second metal film on the second barrier metal film, the first and second barrier metal films being formed of different materials; and etching the second barrier metal film and the second metal film to form a second interconnection layer which is connected to the conductive plug; wherein the etching rate for the second barrier metal film is higher than that for the first barrier metal film.

Therefore, the first barrier metal film will not be substantially etched when the second barrier metal film is etched.

The etching rate for the second barrier metal film is preferably set to be five or more times higher than that for the first barrier metal film.

In a case where the second barrier metal film is a TiN film, the first barrier metal film is formed of TiW or WN and the first metal film is formed of W.

The second metal film is formed of Al or Al alloy.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1A is a plan view showing a semiconductor device according to a first embodiment of this invention;

FIG. 1B is a cross sectional view taken along the 1A—1A line of FIG. 1A;

FIG. 2 is a cross sectional view showing a step of forming a contact hole, for illustrating the process of manufacturing a semiconductor device according to an embodiment of this invention;

FIG. 3 is a cross sectional view showing a step of forming a W plug after the step of FIG. 2;

FIG. 4 is a cross sectional view showing a step of forming a W plug after the step of FIG. 3;

FIG. 5 is a cross sectional view showing a step of forming an interconnection layer after the step of FIG. 4;

FIG. 6A is a cross sectional view showing a step of forming an interconnection layer after the step of FIG. 5;

FIG. 6B is a cross sectional view showing a step of forming an interconnection layer after the step of FIG. 6A;

FIG. 7A is a cross sectional view showing a step following the step of FIG. 6B and indicating a case wherein a mask alignment error has occurred;

FIG. 7B is a cross sectional view showing a step following the step of FIG. 7A and indicating a case wherein a mask alignment error has occurred;

DETAILED DESCRIPTION OF THE INVENTION

Figure 8:
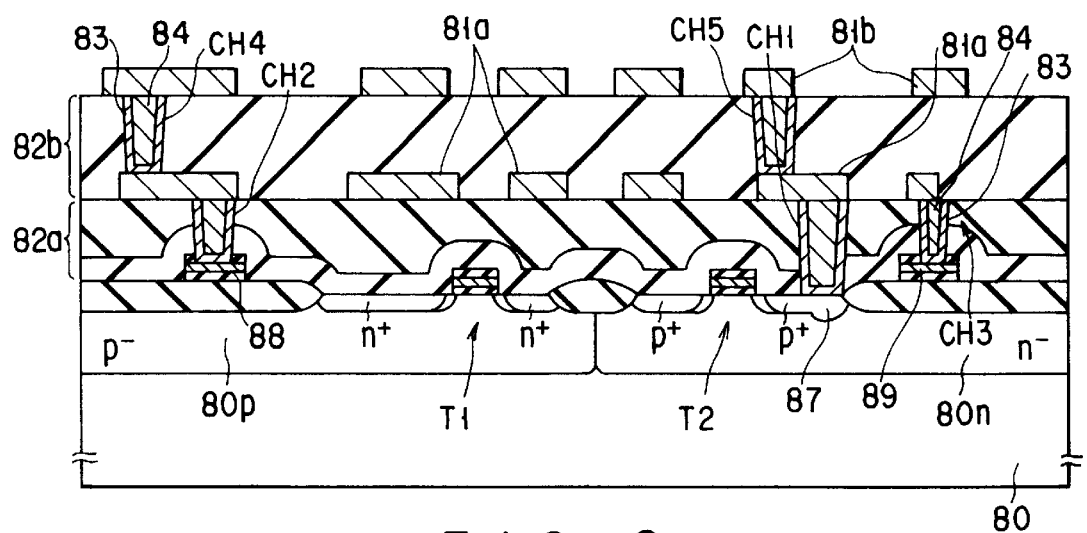
FIG. 8 is a cross sectional view showing a semiconductor device according to a second embodiment of this invention.
Figures 9, 11:
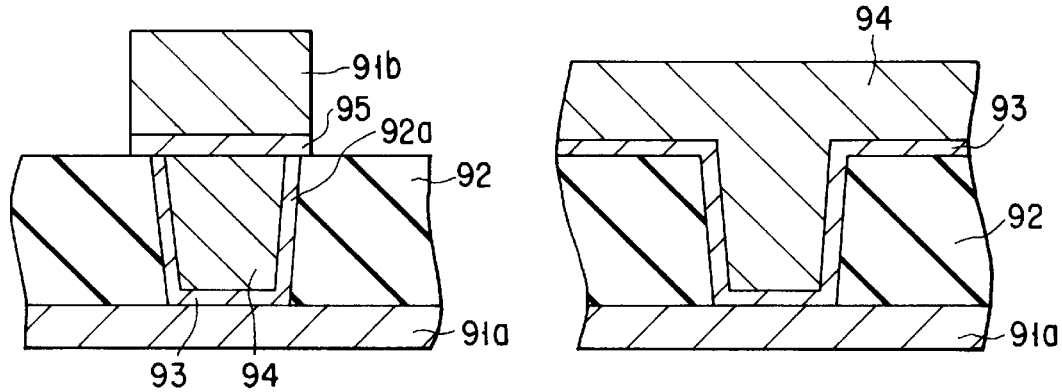
FIG. 9 is a cross sectional view showing a conventional semiconductor device.
FIG. 11 is a cross sectional view showing a step of forming a W plug after the step of FIG. 10.
Figures 10, 12:
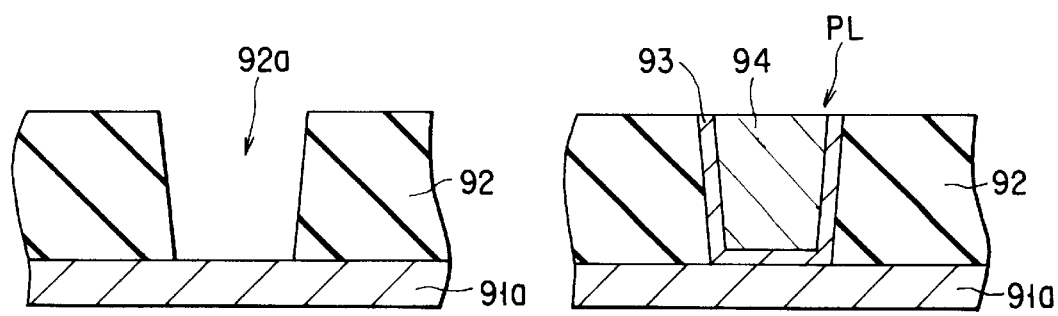
FIG. 10 is a cross sectional view showing a step of forming a contact hole, for illustrating the process of manufacturing the conventional semiconductor device.
FIG. 12 is a cross sectional view showing a step of forming a W plug after the step of FIG. 11.
Figure 13:
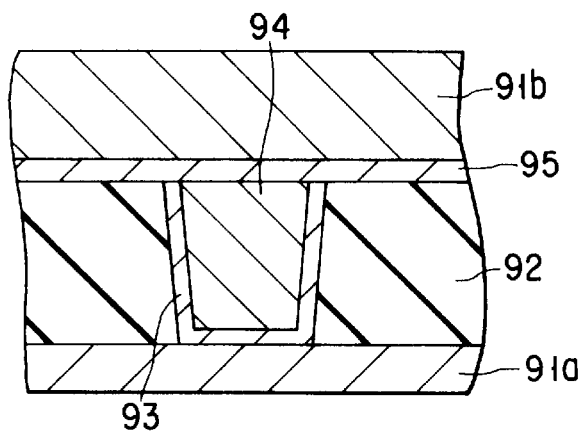
FIG. 13 is a cross sectional view showing a step of forming an interconnection layer after the step of FIG. 12.
Figure 15A:
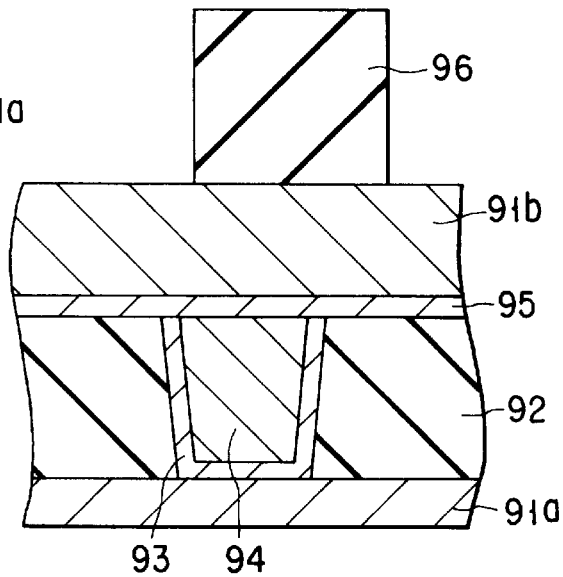
FIG. 15A is a cross sectional view showing a step following the step of FIG. 14B and indicating a case wherein a mask alignment error has occurred.
Figure 14A:
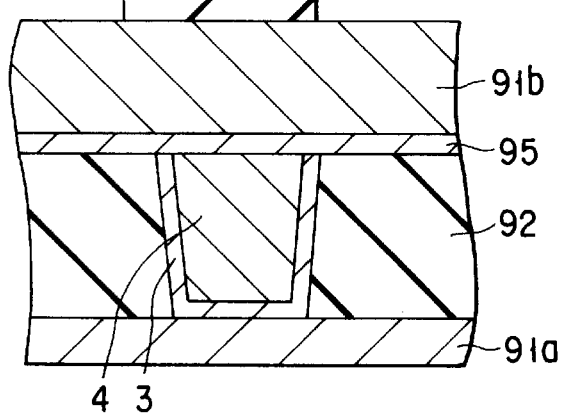
FIG. 14A is a cross sectional view showing a step of forming an interconnection layer after the step of FIG. 13.
Figure 15B:
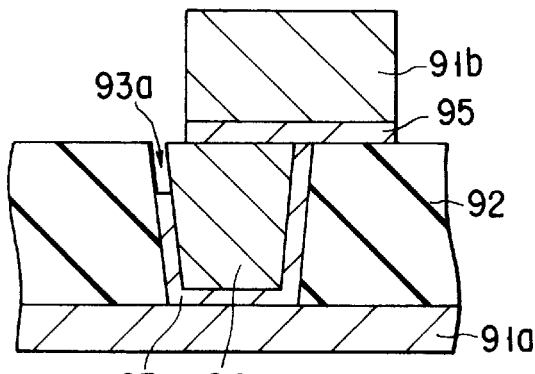
FIG. 15B is a cross sectional view showing a step following the step of FIG. 15A and indicating a case wherein a mask alignment error has occurred.
Figure 14B:
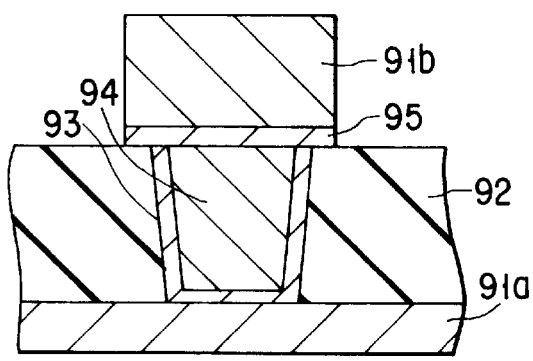
FIG. 14B is a cross sectional view showing a step of forming an interconnection layer after the step of FIG. 14A.

There will now be described a semiconductor device according to a first embodiment of this invention with reference to the accompanying drawings by taking a two-layered interconnection structure as an example.

FIGS. 1A and 1B show a semiconductor device according to the first embodiment of this invention. In FIGS. 1A and 1B, a semiconductor substrate and elements formed in the semiconductor substrate are omitted.

As shown in FIG. 1B, a semiconductor device according to the first embodiment of this invention has an inter-level insulating film 2 of CVD-SiO2 film or the like formed on a first Al film 1a formed as a first interconnection layer. A contact hole 2a is formed in the inter-level insulating film 2 to expose part of the surface of the first Al film 1a. A thin TiW film 3 is formed on the internal side surface and bottom surface of the contact hole 2a and a W film 4 is formed to fill the contact hole 2a so as to form a plug. A TiN film 5 is formed on the plug and a second Al film 1b is formed on the TiN film 5. A second interconnection layer is formed of the TiN film 5 and the second Al film 1b.

In the semiconductor device of this embodiment, the etching rate of etchant used for etching the TiN film 5 is higher for the TiN film 5 than for the TiW film 3. Therefore, even if the mask is formed in a deviated position, the TiW film 3 will not be substantially etched when the TiN film 5 is etched. Thus, a preferable interconnection structure can be formed and the service life and reliability thereof can be enhanced.

Next, a method for manufacturing the semiconductor device according to the first embodiment of this invention is explained.

FIGS. 2 to 7A show a process for forming an interconnection according to the first embodiment of this invention.

(1) As shown in FIG. 2, a first Al film 1a used as a first interconnection layer is formed on a semiconductor substrate (not shown). An inter-level insulating film 2 with a film thickness of approx. 400 nm is formed on the first Al film 1a. The inter-level insulating film 2 is patterned into a preset shape by the RIE technique to form a contact hole 2a therein to partly expose the surface of the first Al film 1a. The diameter of the contact hole 2a is approx. 0.45 to 0.5 µm.

(2) As shown in FIG. 3, a TiW film 3 used as a grow layer is formed on the inter-level insulating film 2, the internal side surface of the contact hole and the first Al film 1a exposed in the contact hole by DC magnetron sputtering. After this, a W film 4 is formed in the contact hole by the CVD method. The film thickness of the first TiW film 3 is approx. 100 nm and the film thickness of the W film 4 is approx. 400 nm.

The chemical reaction at the time of formation of the W film 4 utilizes, for example, a reducing process using WF6 and reducing gas as is well known in the art. Generally, an initial reaction is difficult to occur on the insulating film. Therefore, by forming the grow layer formed of the TiW film 3 and using hydrogen gas or SiH4 gas as a reducing gas, the reaction for forming the W film 4 is made active. Therefore, it becomes possible to form the W film 4 from the internal portion of the contact hole to the surface of the insulating film.

(3) Next, as shown in FIG. 4, the planarization process is effected by the RIE technique using F-series or O-series gas to remove by etching the W film 4 and TiW film 3 formed in a portion higher than the surface level of the inter-level insulating film 2 so as to form a plug PL in the contact hole.

(4) Then, as shown in FIG. 5, a TiN film 5 is formed on the inter-level insulating film 2 and the plug PL by DC magnetron sputtering and a second Al film 1b is formed on the TiN film 5. The film thickness of the TiN film 5 is approx. 50 nm and the film thickness of the Al film 1b is approx. 800 nm. Since the TiN film 5 and second Al film 1b are successively formed, the grain size of Al can be made as small as approx. 2 µm or less and uniform and the reliability of the interconnection can be enhanced.

(5) Next, after a resist 6 is formed on the entire surface of the second Al film 1b to a thickness of approx. 2.0 µm, the resist 6 is patterned by the lithography technology to have a width of 0.45 to 0.5 µm substantially equal to the diameter of the contact hole 2a as shown in FIG. 6A. After this, the second Al film 1b and TiN film 5 are etched by RIE using Cl-(chlorine)-series gas with the patterned resist 6 used as a mask to form a second interconnection layer as shown in FIG. 6B.

Time required for etching the second Al film 1b is approx. 150 sec and time required for etching the TiN film 5 is approx. 8 sec. That is, in this step, the etching process is effected for approx. 158 sec.

In this embodiment, the etching rates for the TiN film 5 and TiW film 3 by RIE using Cl-series gas are respectively approx. 500 nm/min and approx. 100 nm/min and thus the etching rate for the TiN film 5 is five or more times faster than that for the TiW film 3. Therefore, in the process (5), even if the mask used for formation of the resist 6 is deviated from the position of the contact hole as shown in FIG. 7A, the TiW film 3 will not be etched. Specifically, the TiW 3 will be etched only by approx. 3 nm even if variations in the film thicknesses of the TiN film 5 and second Al film 1b are taken into consideration. Thus, as shown in FIG. 7B, the TiW film 3 formed in the contact hole is not etched and no void will be formed in the succeeding step of forming an insulating film. Therefore, according to this embodiment, an interconnection structure with stable characteristic, long service life and high reliability can be formed.

Further, since the bond strength between the TiW film 3 and the TiN film 5 is high, the TiN film 5 is bonded not only to the W film 4 but also to the TiW film 3 and thus bonding between the films can be stably held in good condition.

As the contact hole is shallower or the aspect ratio thereof is lower, the possibility that the interconnection is made defective by occurrence of a void becomes stronger, and therefore, the effect attained by suppressing occurrence of void in this invention is significant. Further, as the interconnection pattern is narrower, the mask alignment error tends to occur, and therefore, as the size of the element becomes smaller, the effect of suppressing occurrence of void in this invention becomes more significant.

This invention is not limited to the above embodiment and can be modified as follows.

(1) In the first embodiment, a case wherein this invention is applied to the contact hole (via hole) used for connecting metal interconnection layers to each other, but it is possible to apply this invention to a contact hole used for connecting an interconnection layer to a diffusion region forming a MOS transistor as shown in FIG. 8, for example.

FIG. 8 shows a semiconductor device according to a second embodiment of this invention. In FIG. 8, a p-type well 80p and n-type well 80n are formed in a p-type semiconductor substrate 80. An n-channel MOS transistor T1 with LDD (lightly doped drain) structure is formed in the p-type well 80p and a p-channel MOS transistor T2 with LDD structure is formed in the n-type well 80n. An inter-level insulating film 82a is formed on the entire surface of the substrate containing the above two transistors and a plurality of first interconnection layers 81a are formed on the inter-level insulating film 82a. An inter-level insulating film 82b is formed on the first interconnection layers 81a and the inter-level insulating film 82a and a plurality of second interconnection layers 81b are formed on the inter-level insulating film 82b.

In the inter-level insulating film 82a, for example, a contact hole CH1 used for connecting a diffusion region 87 of the p-channel MOS transistor T2 with a corresponding one of the first interconnection layers 81a and contact holes CH2, CH3 used for connecting interconnection layers 88, 89 including electrodes with corresponding ones of the first interconnection layers 81a are formed. In the inter-level insulating film 82b, contact holes CH4, CH5 used for connecting the first interconnection layers 81a with the second interconnection layers 81b are formed. Inside the contact holes CH1 to CH5, plugs each formed of a grow layer of a TiW film 83 and a W film 84 are formed. The first and second interconnection layers 81a, 81b are each formed of a TiN/Al alloy, for example. Also, in the second embodiment, the reliability of the interconnection can be enhanced.

In FIG. 8, the length of the plugs for connecting the first interconnection layers 81a with the interconnection layers 88, 89 is made shorter than that of the plug for connecting the first interconnection layer 81a with the diffusion region 87. The reliability of the interconnection can be enhanced particularly when this invention is applied to a short plug.

(2) The film thicknesses are not limited to the values used in the above embodiment. In this invention, since the TiW film 3 covering the side surface of the contact hole is not practically etched even when a mask alignment error has occurred, it is only required to form a film of minimum sufficient film thickness as the grow layer.

(3) As the grow layer, a WN film can be used instead of the TiW film 3. In the RIE process using Cl-series gas, the WN film formed on the internal side surface of the contact hole is not etched even if a mask alignment error has occurred since the selective etching ratio for the WN film and the TiN film 5 is low. Therefore, after an insulating film is formed on the WN film no void is formed in the contact hole. As a result, like the first embodiment, the reliability of the interconnection can be enhanced.

(4) As an interconnection layer formed on the W plug, an interconnection material formed on the plug is not limited to Al but another material such as Al—Si—Cu may be used if the underlying layer is the TiN film 5. Further, it is possible to form a TiN film or the like having a reflection reducing function on the interconnection material.

In a case where the interconnection material formed on the TiN film 5 is formed of an Al alloy (in this case, Al in a single form is also contained), a stress applied to the Al alloy film can be reduced since the TiN film 5 has a higher Young's modulus than the Al alloy film. Therefore, use of the above film is effective to enhance the reliability of the interconnection. Particularly, this effect becomes significant when the interconnection width is small. Therefore, in a semiconductor device which is finally completed, a significant effect of enhancing the reliability of the interconnection of this invention can be attained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

I claim:

1. A method for manufacturing a semiconductor device, comprising the steps of:

forming an insulating film on a semiconductor substrate having a first interconnection layer formed thereon;

forming a contact hole in the insulating film to partly expose the first interconnection layer;

forming a conductive plug including a first barrier metal film which is formed on the internal side surface and bottom surface of the contact hole and a first metal film which is filled in the contact hole and formed in contact with the first barrier metal film;

forming a second barrier metal film on the semiconductor substrate to cover the first barrier metal film and the first metal film and forming a second metal film on the second barrier metal film, said first and second barrier metal films being formed of different materials; and etching the second barrier metal film and the second metal film to form a second interconnection layer which is connected to the conductive plug;

wherein the etching rate for the second barrier metal film is faster than that for the first barrier metal film.

2. A method according to claim 1, wherein the second barrier metal film and the second metal film are etched by the RIE technique using chlorine-series gas as an etchant.

3. A method according to claim 1, wherein the first barrier metal film is formed of one of TiW and WN and the first metal film is formed of W when the second barrier metal film is formed of a TiN film.

4. A method according to claim 1, wherein the second metal film is formed of one of Al and Al alloy.

5. A method for manufacturing a semiconductor device, comprising the steps of:

forming an insulating film on a semiconductor substrate having an impurity diffusion region formed therein;

forming a contact hole in the first insulating film to expose the impurity diffusion region;

forming a conductive plug including a first barrier metal film which is formed on the internal side surface and bottom surface of the contact hole and a first metal film which is filled in the contact hole and formed in contact with the first barrier metal film;

forming a second barrier metal film on the semiconductor substrate to cover the first barrier metal film and the first metal film and forming a second metal film on the second barrier metal film, said first and second barrier metal films being formed of different materials; and etching the second barrier metal film and the second metal film to form a second interconnection layer which is connected to the conductive plug;

wherein the etching rate for the second barrier metal film is faster than that for the first barrier metal film.

6. A method according to claim 5, wherein the second barrier metal film and the second metal film are etched by the RIE technique using chlorine-series gas as an etchant.

7. A method according to claim 5, wherein the first barrier metal film is formed of one of TiW and WN and the first metal film is formed of W when the second barrier metal film is formed of a TiN film.

8. A method according to claim 5, wherein the second metal film is formed of one of Al and Al alloy.

* * * * *